United States Patent [19]

Mannerstrom

[11] Patent Number: 4,625,178
[45] Date of Patent: Nov. 25, 1986

[54] FEEDFORWARD GAIN BLOCK WITH MIRROR IMAGE ERROR AMPLIFIER

[75] Inventor: Leif R. Mannerstrom, North Vancouver, Canada

[73] Assignee: General Instrument Corporation, New York, N.Y.

[21] Appl. No.: 756,828

[22] Filed: Jul. 19, 1985

[51] Int. Cl.$^4$ .............................................. H03G 1/32
[52] U.S. Cl. ...................................... 330/149; 330/66; 330/68; 330/151; 361/388; 361/394
[58] Field of Search ..................... 330/65, 66, 68, 149, 330/151; 361/380, 388, 389, 394, 422

[56] References Cited

U.S. PATENT DOCUMENTS 4,472,725  9/1984  Blumenkrane .................. 330/151 X Primary Examiner—James B. Mullins
Attorney, Agent, or Firm—William L. Botjer

[57] ABSTRACT

A feedforward amplifier arranged as a unitized gain block particularly suitable for use in cable communication systems. The feedforward amplifier includes a single circuit board integrally mounting the directional couplers, delay lines and attenuator circuitry in a symmetrical arrangement. The main and error amplifiers are mounted separately from the main circuit board via releasable connectors and each amplifier is arranged on its substrate as a mirror image of the other to provide a symmetrical signal path. The amplifiers and the circuit board are enclosed within a compact metal housing which provides heat sinking for the amplifiers and facilitates removal of the amplifiers for servicing.

14 Claims, 5 Drawing Figures

FIG. I.
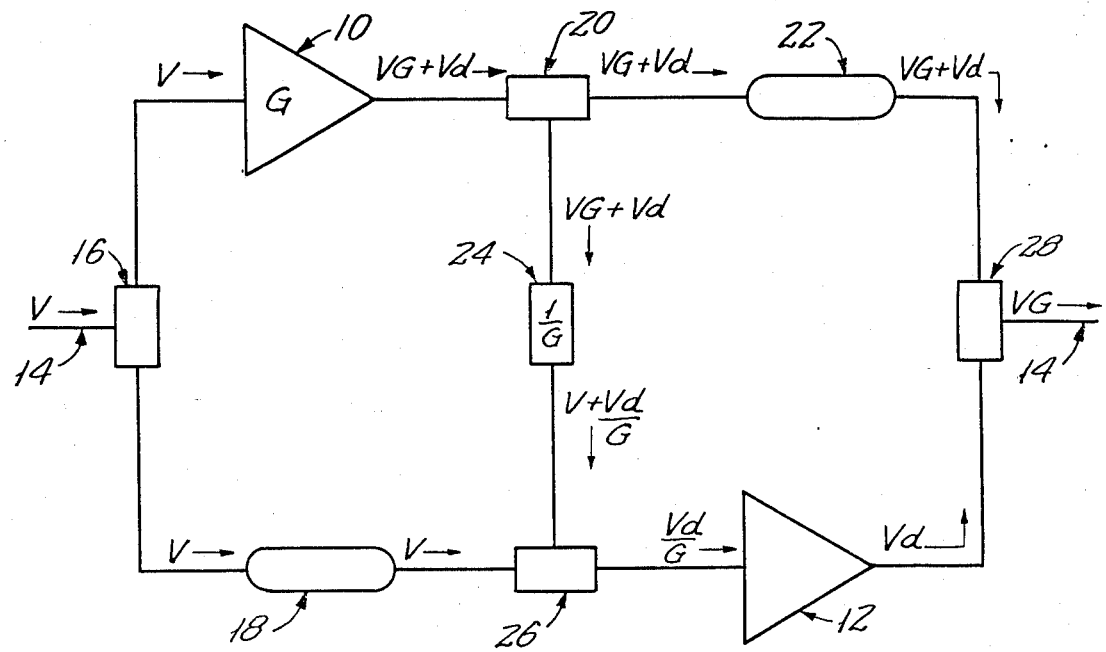
FIG. 3.
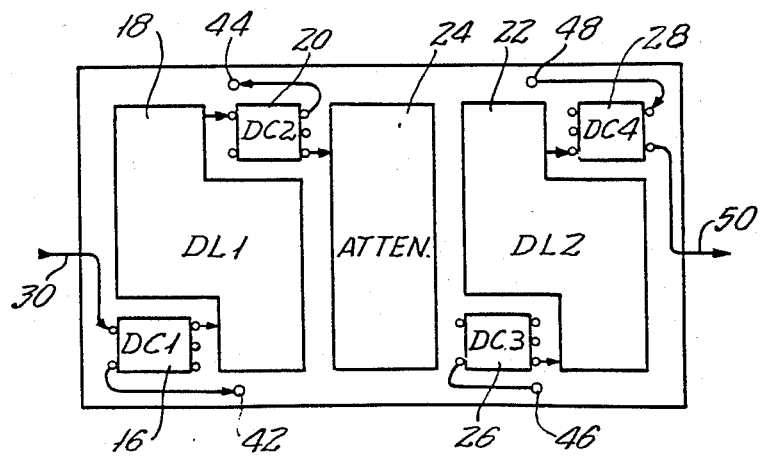

FEEDFORWARD GAIN BLOCK WITH MIRROR IMAGE ERROR AMPLIFIER

BACKGROUND AND SUMMARY OF THE INVENTION

This invention relates to feedforward amplifiers used in cable communication systems and particularly to the construction of a unitized gain block for a feedforward amplifier.

Recently so called "feedforward" amplifiers have been utilized in cable communication systems because of their relatively distortion-free amplification. Distortion-free amplification allows cable companies to increase the spacing of the amplifiers in their communication lines with a concurrent decrease in the number of amplifiers used. Furthermore, feedforward amplifiers have a wide bandwidth and thus can amplify a large number of channels having widely disparate frequencies. Broadband amplification is necessary as more and more cable systems increase the number of channels available to their customers.

Feedforward amplifiers are able to provide relatively distortion-free amplification by extracting from the amplified signal a signal component representative of the distortion introduced by the amplifier, phase inverting that component, and then recombining the phase inverted distortion component with the amplified signal. The phase inverted distortion component cancels the distortion component in the amplified signal, leaving a relatively distortion-free amplified signal for transmission along the cable. To avoid further distortion, the signals must coincide precisely in time when they are recombined. To ensure such coincidence, delay means are provided to delay the signals and thereby compensate for time delays which arise when the signals pass through the various electronic components in the amplifier.

In U.S. Pat. No. 4,472,725 (Blumenkranz), the disclosure of which is hereby incorporated by reference as if fully set forth herein, electronic delay lines particularly suitable for use in a feedforward amplifier in a cable communication system are disclosed. The delay lines disclosed in this patent provide the precise time delay necessary for efficient and accurate operation of the feedforward amplifier. However, merely providing precisely matched delay lines does not eliminate all possible sources of phase variation between the main and the error signals. Ideally, the main and the error signals should have paths through the directional couplers, delay means and amplifiers which are identical in length. However to date, the circuit topology of the circuit board and particularly, the main and error amplifiers, has not permitted the main and error signal paths to be precisely matched.

Additionally, prior feedforward amplifiers have utilized delay lines which are mounted to the main circuit board as separate subassemblies. The use of separate subassemblies, in addition to making it more difficult to provide matched signal paths through the amplifier, increases the size, cost and difficulty of assembly. Furthermore, if the size of conventional feedforward amplifiers is reduced by conventional means, amplifier heat transfer problems may arise. The present invention is directed to providing a unitized gain block for a feedforward amplifier having matched signals paths, minimum size and maximum heat transfer.

It is an object of this invention to provide a feedforward amplifier in which the paths of the main and error signals through the directional couplers, delay lines and amplifiers are identical.

It is another object of this invention to provide a feedforward amplifier in which the delay lines, directional couplers and attenuator circuitry are integral with, and disposed on, the main circuit board.

It is another object of this invention to provide a feedforward amplifier which minimizes the size of the circuitry while maximizing the heat transfer from the main and error amplifiers.

It is another object of this invention to provide a feedforward amplifier that enhances serviceability by facilitating replacement of the main and error amplifiers.

Still other objects of the invention will become apparent upon a reading of the detailed specification to follow.

To these ends, a unitized gain block for a feedforward amplifier is provided. The directional couplers, delay lines and attenuator circuitry are all disposed integrally on a single circuit board in a symmetrical arrangement having matched signal paths. The main and error amplifiers are mounted separately from the main circuit board via releasable connectors. The main and error amplifiers are arranged on their substrates as mirror images of each other to provide symmetrical signal paths. The amplifiers and the circuit board are enclosed within a compact metal housing which provides heat sinking for the amplifiers, yet permits ready removal of the amplifiers for servicing.

BRIEF DESCRIPTION OF THE DRAWINGS

For a better understanding of the invention, reference is made to the following drawings which are to be taken in connection with the detailed description of the invention:

FIG. 1 is a block diagram of an ideal feedforward amplifier;

FIG. 3 is a plan view of the topology of the main circuit board of the present invention;

FIG. 6 is a plan view of the underside of the housing of the gain block with the main and error amplifiers removed; and FIG. 7 is a plan view of the main and error amplifiers.

DESCRIPTION OF THE PREFERRED EMBODIMENT

Figure 2:
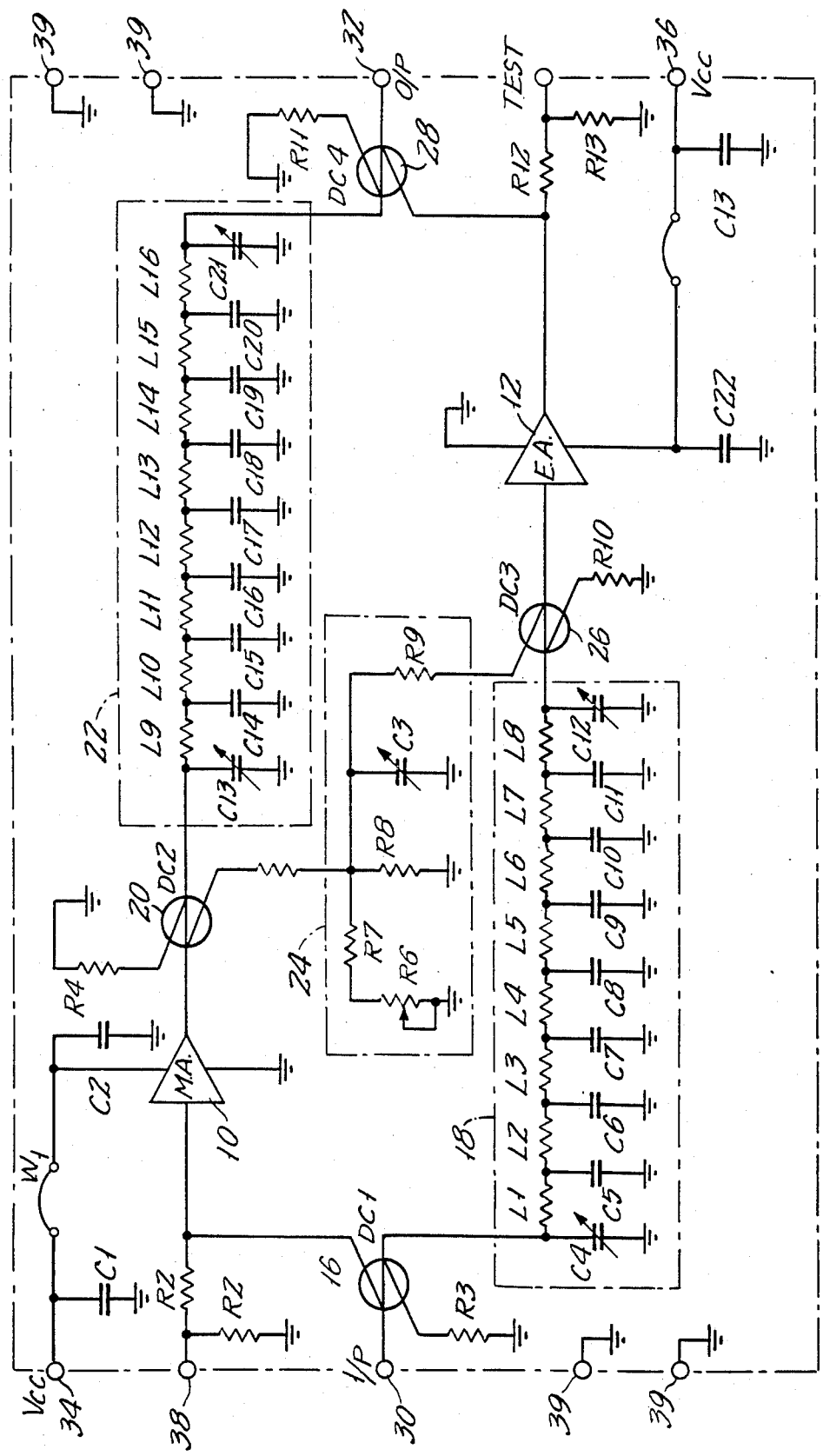
FIG. 2 is a schematic diagram of the circuitry for a feedforward amplifier constructed in accordance with the instant invention.

The basic principles of operation of an ideal feedforward amplifier are first described with reference to FIG. 1 to provide a framework for understanding the invention.

FIG. 1 is a block diagram of an ideal (lossless) feedforward amplifier which includes a main amplifier 10 and an error amplifier 12. An RF signal "V" which is to be amplified is coupled from cable 14 to first directional coupler 16 which splits the signal into two portions, one of which is delivered to the input terminal of main amplifier 10 and the other of which is delivered to first delay means 18. The amplified signal appearing at the output terminal of main amplifier 10 has the form "VG+$V_d$", where "G" represents the gain of main amplifier 10 and "$V_d$" represents the signal distortion inherently introduced by the amplification process. Ideally, the distortion component $V_d$ is to be eliminated to yield a "pure" amplified signal "VG".

The amplified signal "VG+$V_d$", which is 180° out of phase with respect to the input signal V, is coupled to second directional coupler 20 which splits the amplified signal into two portions, one of which is directed to second delay means 22 and the other of which is directed to attenuator 24. Attenuator 24 is adjusted to attenuate signals passing therethrough by an amount which is inversely proportional to the gain "G" of main amplifier 10. Accordingly, the signal appearing at the output terminal of attenuator 24 has the form "V+Vd/G". Thus attenuated signal portion is coupled to third directional coupler 26 which combines it with the non-amplified signal portion passed through first delay means 18.

First delay means 18 is included to ensure that the non-amplified signal portion reaching third directional coupler 26 will coincide precisely in time with the attenuated signal portion passed to third directional coupler 26 by attenuator 24. If these signals do not coincide precisely in time then undesirable distortion results when they are combined.

Because the attenuated signal portion is 180° out of phase with respect to the non-amplified signal portion, signals in the two portions representative of the input signal "V" cancel one another, so that the signal leaving third directional coupler 26 has the form "Vd/G". Ideally, and to simplify the background discussion, the gain of error amplifier 12 is equal to the gain "G" of main amplifier 10. Thus, a signal representative of the distortion component "$V_d$" introduced by main amplifier 10 appears at the output terminal of error amplifier 12.

Second delay means 22 delays the amplified signal "VG+$V_d$" before presenting it to fourth directional coupler 28 so that it coincides precisely in time with the error amplifier output signal, which is also presented to fourth directional coupler 28. The signal "$V_d$" appearing at the output of error amplifier 12 is 180° out of phase with respect to the signal leaving second delay means 22. Accordingly, when the error amplifier output signal is combined by fourth directional coupler 28 with the output signal from second delay means 22, signal components representative of the distortion "$V_d$" introduced by main amplifier 10 precisely cancel one another, leaving a "pure" amplified signal "VG" for passage along cable 14.

As can be seen from the above discussion, in order for a feedforward amplifier to operate with minimum distortion, the time delay of the main and error signals must be precisely matched. Accordingly, the main and error signal paths must be as identical in length as possible. The signal paths should be matched through all circuit components including the main and error amplifiers.

FIG. 2 is a schematic diagram of the circuitry of the gain block of a feedforward amplifier constructed in accordance with the present invention. In FIG. 2, the circuit components have been labelled with the same reference numerals as used in FIG. 1. As is seen, delay line 18 comprises a series of eight inductive coils (L1 through L8) each of which is shunted by capacitors (C4 through C12). The end capacitors C4, C12 are adjustable to permit tuning of delay line 18. Similarly, delay line 22 comprises inductive coils L9 through L16 shunted by capacitors C13 through C21, with capacitors C13 and C21 being adjustable. Attenuator 24 comprises an RC circuit having a T resistance pad with a variable resistor R6 for adjusting the attenuation of the signals passing from directional coupler 20 to directional coupler 26. Adjustable capacitor C3 is provided for adjusting the attenuator frequency response. Directional couplers 16, 20, 26 and 28 are formed by three winding ferrite transformers operating as biconjugate devices.

As is explained in greater detail below, main amplifier 10 and error amplifier 12 are mirror image pairs of matched hybrid amplifiers. The circuitry includes an input connector 30 for passing the signal to be amplified to directional coupler 16. The output of the feedforward amplifier is supplied to an output connector 32. Connectors 34, 36 supply operating voltage $V_{cc}$ to amplifiers 10 and 12, respectively. A connector 38 is provided for direct connection of a test signal to the input of main amplifier 10 and a connector 40 is connected to the output of error amplifier 12 for the output of the test signal. Connectors 39 are coupled to ground.

FIG. 3 illustrates the topology of the main circuit board of the amplifier which mounts the components forming directional couplers 16, 20, 26 and 28, delay lines 18 and 22 and attenuator 24. The input signal arriving via connector 30 is provided to the input of directional coupler 16 which acts as a signal splitter. The first output of directional coupler 16 is provided to a connector 42 which is coupled to the input of main amplifier 10. The second output of directional coupler 16 is connected to the input of delay line 18 whose output is provided to the input of directional coupler 20 which operates as a splitter. The first output of directional coupler 20 is provided to a connector 44 which is coupled to the input of error amplifier 12. The second output of directional coupler 20 is connected to the input of attenuator circuit 24.

The output of attenuator circuit 24 is provided to the first input of directional coupler 26 operating as a signal combiner. The second input of directional coupler 26 is connected to connector 46 which is coupled to the output of main amplifier 10. The output of directional coupler 26 is connected to the input of delay line 22 whose output is provided to the first input of directional coupler 28 operated as a signal combiner. The second input of directional coupler 28 is connected to a connector 48 which is coupled to the output of error amplifier 12. The output of directional coupler 28 is provided to the output connector 40 of the feedforward gain block.

It is noted that the above-described layout of the main circuit board for the feedforward amplifier provides a symmetrical signal path with minimal length between the electronic components forming the directional couplers, delay lines and attenuator circuitry. As shown in FIG. 3, the circuit board has three distinct regions, with the attenuation circuitry 24 dividing the board. Delay line 18 is disposed diagonally across the first region of the circuit board with directional couplers 16 and 20 disposed at the lower left and upper right corners, respectively. Attenuator circuitry 24 forms the second central region. Delay line 22 is disposed diagonally across the third region with directional coupler 26 at the lower left hand corner and directional coupler 28 at the upper right hand corner. This arrangement permits the coils and capacitors forming the delay lines to be mounted directly on the main circuit board without the need for separate subassemblies and with minimal connection length between each component.

It is further noted that even though the main amplifier 10 and error amplifier 12 are disposed beneath the main circuit board, each operates in a "left to right" configuration with the input on the left hand side and the output on the right hand side as shown in FIG. 3. This is accomplished by the mirror image arrangement of amplifiers 10, 12 which is discussed in detail below.

Figure 4:
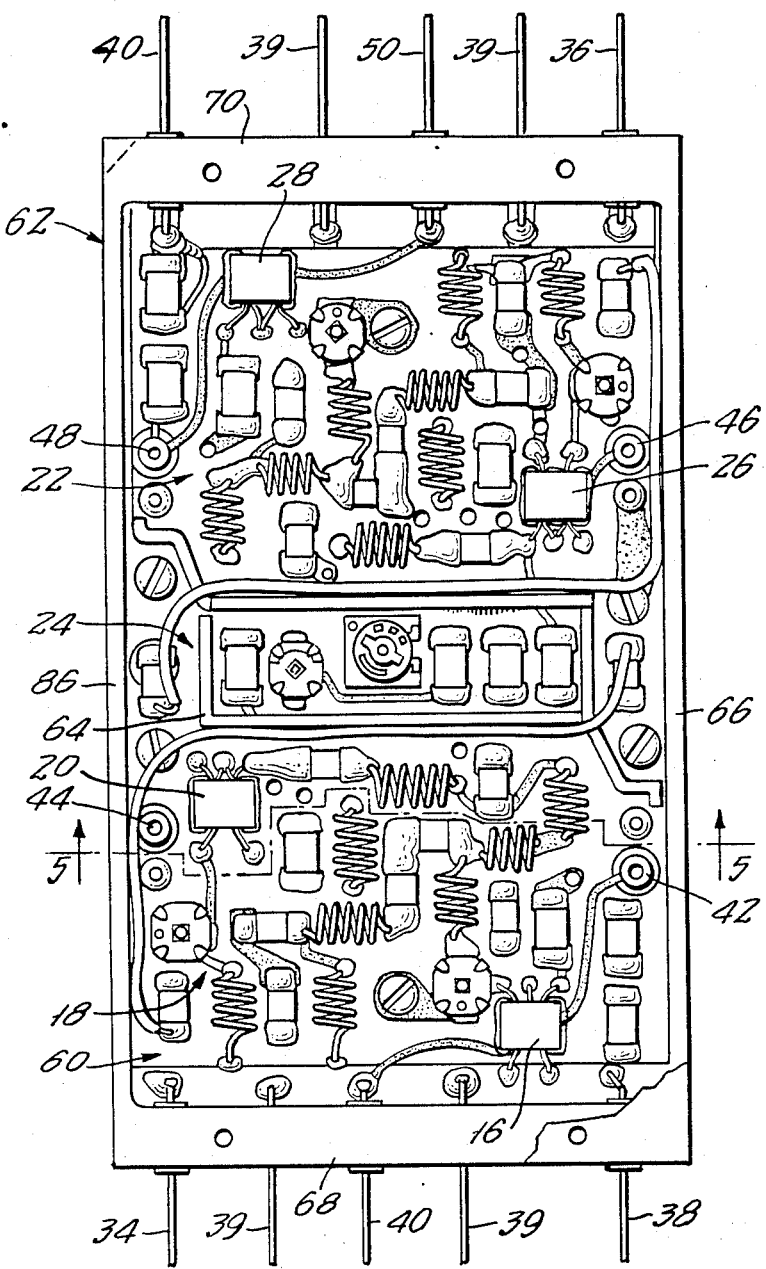
FIG. 4 is a plan view of the circuitry and components of the main circuit board disposed in the housing.
Figure 5:
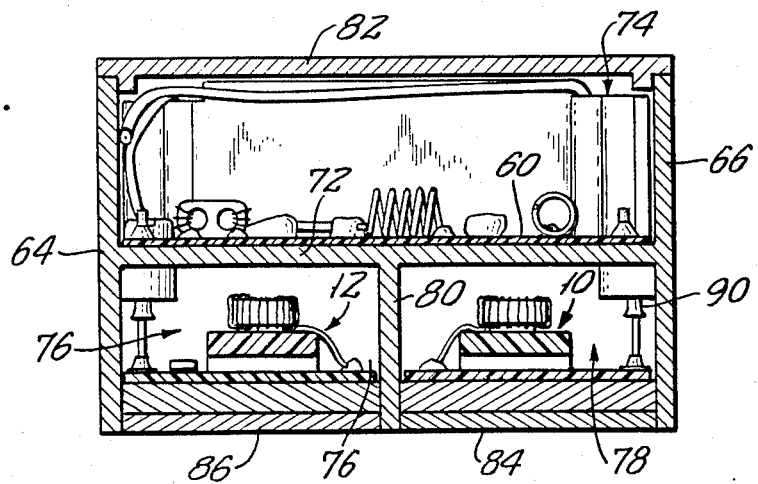
FIG. 5 is a sectional view taken along line 5—5 of FIG. 4.

FIGS. 4 and 5 illustrate the main circuit board 60 carrying the circuit components mounted in a rectangular prismatic housing 62. Housing 62 includes side walls 64 and 66, end walls 68 and 70, as well as a central platform 72 to which printed circuit board 60 is mounted. Platform 72 divides housing 62 into an upper chamber 74 and two lower chambers 76, 78 which are separated by a partition 80. Main amplifier 10 is disposed in chamber 78 and error amplifier 12 is disposed in chamber 76. As is discussed in detail below, main amplifier 10 and error amplifier 12 are disposed beneath printed circuit board 60 via releasable connectors which accommodate misalignment between the amplifiers and the printed circuit board. Thus, amplifiers 10 and 12 may be positioned in close contact with housing 62 to permit maximum heat transfer therebetween. Input and output connectors 30, 32, 34, 38, 40 and 41 extend through end walls 68 and 70 and are insulated therefrom. Delay lines 18, 22 are shielded from each other and from attenuator circuitry 24 by means of a metallic shield 86 in the form of an open box surrounding attenuator circuitry 24 and mounted within chamber 74 between walls 64 and 66. A removable cover plate 82 is located over chamber 74 and removable cover plates 84, 86 are located over chambers 76, 78. A suitable material for the construction of housing 62 is aluminum, which acts as a heat sink, in addition to securely mounting the circuit board and the amplifiers.

FIG. 6 illustrates the underside of housing 62 with main amplifier 10 and error amplifier 12 removed. Disposed within chambers 76, 78 and along side walls 64, 66 are a series of connector receptacles 90 for receiving the connector pins of amplifiers 10, 12 and which are in turn connected to circuit board 60. Connector receptacles 90 are annular in configuration for receiving the cylindrical connector pins of the amplifiers without the need for soldering to facilitate removal and replacement of the amplifiers. Chamber 78 includes ledges 92 for mounting main amplifier 10 and chamber 76 includes ledges 94 for mounting error amplifier 12. Ledges 92, 94 provide a thermally conductive connection between the heat sinks of amplifiers 10, 12 and housing 62 to permit housing 62 to act as a large heat sink. It is noted that the connector receptacles 90 forming the inputs 44, 42 to their respective main 10 and error amplifiers 12 are each disposed on the left hand side of housing 62 as shown of FIG. 6. Therefore, connector receptacles 90 forming main and error amplifier outputs 46, 48 are disposed on the right hand side. Thus each amplifier operates "left to right" even though the connector receptacles 90 are disposed along the outer edges of housing 62. The "left to right" operation occurs because of the "mirror image" configuration of the main and error amplifier which is discussed in detail below.

FIG. 7 is a plan view of main amplifier 10 and error amplifier 12. The discrete components of main amplifier 10 are disposed on an insulative substrate 100 which, in turn, is disposed in heat conductive relation on a metallic heat sink 102. Disposed along the upper edge, as shown in FIG. 7, of substrate 100 are a series of upstanding connector pins 104, 106, 108, 110 and 112 for connection with the appropriate connector receptacles 90 of housing 62. Pin 104 is the input pin of amplifier 10 and is connected to the connector receptacle 90 which is connected to connector 42 disposed on main circuit board 60. Pin 112 carries the output of main amplifier 10 and is connected through a receptacle 90 to connector 46 of printed circuit board 60. Pin 108 carries the operating voltage $V_{cc}$ for main amplifier 10 while pins 106, 110 are ground pins. Disposed above substrate 100 is an insulative bracket 114 mounting three ferrite cores 116 which form coupling transformers for the signals carried by main amplifier 10. Main amplifier 10 as shown in FIG. 7 is of a standard configuration, such as a Motorola SHW545 hybrid amplifier.

Error amplifier 12 is formed on an insulative substrate 118 which is mounted in thermally conductive relation on a metallic heat sink 120. Connector pins 122, 124, 125, 126 and 128 are disposed along the lower edge of error amplifier 12 as is seen in FIG. 7. Pin 122 is the input to error amplifier 10 and is connected through the appropriate receptacle 90 to connector 44 on circuit board 60. Pin 128 is the output pin for error amplifier 12 and is connected through the appropriate receptacle 90 to connector 48 on printed circuit board 60. Pin 125 carries operating voltage $V_{cc}$ to error amplifier 12 and pins 124 and 126 are ground pins. An insulative bracket 132 carries ferrite cores 134 forming the coupling transformers for the signals of error amplifier 12.

As is seen in FIG. 7, the layout of error amplifier 12 is a mirror image of that of main amplifier 10, in that the connector pins are disposed along the upper side of error amplifier 10 and that the circuit elements are arranged on substrate 118 in a mirror image of that of substrate 100. Additionally, this mirror image arrangement may be extended so that the active semiconductors in each amplifier are arranged as mirror images of each other. The mirror image arrangement permits the input pins 104, 122 of both amplifiers to be disposed on one side of each amplifier with the output pins 112, 128 disposed on the other side. The mirror image arrangement provides a symmetrical signal path through both amplifiers. A suitable amplifier for use as error amplifier 12 has electrical characteristics identical to that of main amplifier 10. If a Motorola SHW545 amplifier is used as main amplifier 10, a suitable error amplifier 12 is a custom designed SHW545 amplifier arranged in the mirror image configuration described above.

The heat sinks 102, 120 of each amplifier include mounting holes 136 for alignment with mounting holes 138 in ledges 92, 94 of chambers 78, 76. Thus, when amplifiers 10 and 12 are mounted in chambers 78, 76 their heat sinks will be in thermally conductive contact with ledges 92, 94. Because ledges 92, 94 are part of housing 62, heat will be transferred from the amplifiers through the ledges to the entire housing 62 which forms a large heat sink for the amplifiers. This permits amplifiers 10 and 12 to be spaced closely together without causing overheating problems. Because amplifiers 10, 12 are connected to circuit board 60 via connector receptacles 90 which accommodate misalignment, optimal heat conductive contact between amplifiers 10, 12 and housing 62 is assured. Releasable connector receptacles 90 thus provide a variable spacial relationship between amplifiers 10, 12 and circuit board 60 with a fixed relationship between amplifiers 10, 12 and housing 62. The underside of housing 62 includes threaded mounting holes 140 to permit its attachment to an external heat sink to further facilitate heat transfer. Because each amplifier is disposed in a separate chamber and each is connected to the main circuit board via releasable connectors, the amplifiers may be readily replaced after removing covers 84, 86 from the lower portion of housing 62. This arrangement facilitates assembly and servicing.

The above-described construction provides a feedforward amplifier having matched signal paths, minimum size but maximum heat transfer. Although the present invention has been described in conjunction with a preferred embodiment, it is to be understood that modifications and variations may be resorted to without departing from the spirit and scope of the invention, as those skilled in the art will readily understand. Such modifications and variations are considered to be within the purview and scope of the invention and the appended claims.

What is claimed is:

1. A feedforward amplifier, comprising:
   (a) a main amplifier for producing a first output signal;
   (b) an error amplifier for producing a second output signal;
   (c) first and second delay means;
   (d) a first directional coupler for splitting an input RF signal and for directing portions of said input RF signal to the input of said main amplifier and to the input of said first delay means;
   (e) a second directional coupler for splitting said first output signal and for directing portions of said first output signal to the input of said second delay means and to a third directional coupler;
   (f) said third directional coupler for combining the portion of said first output signal received from said second directional coupler with an output signal from said first delay means and for directing the combined signals to the input of said error amplifier;
   (g) a fourth directional coupler for combining an output signal from said second delay means with said second output signal and for directing the combined signals to an output port; and
   (h) the components of said main amplifier and said error amplifier being disposed on respective substrates, the components of said error amplifier being constructed and arranged substantially as a mirror image of the arrangement of the components of said main amplifier.

2. The feedforward amplifier as claimed in claim 1, further including signal attenuation means connected between said second and third directional couplers to attenuate said first output signal.

3. The feedforward amplifier as claimed in claim 2, wherein said first and second delay means, said attenuation means, and said first, second, third and fourth directional couplers are disposed integrally on a single circuit board.

4. The feedforward amplifier as claimed in claim 3, wherein said main and said error amplifiers include heat sinks and are disposed apart from said single circuit board and are connected thereto by releasable connector means.

5. The feedforward amplifier as claimed in claim 4, wherein said single circuit board and said main and error amplifier are disposed within a housing of heat conductive material with said heat sinks of said amplifiers being in thermally conductive contact with said housing.

6. The feedforward amplifier as claimed in claim 5, wherein said housing includes first, second and third chambers, said single circuit board being disposed in said first chamber with said main and error amplifiers being disposed in said second and third chambers respectively.

7. The feedforward amplifier as claimed in claim 6, further including releasable cover means disposed over said first and second and third chambers.

8. In a feedforward amplifier of the type having a main and an error amplifier, directional couplers, delay lines and attenuator means, the improvement comprising:
   (a) said directional couplers, said delay lines and said attenuator means being disposed on a common circuit board;
   (b) said main and said error amplifier being disposed separately from said common circuit board and being connected thereto by means of releasable connector means;
   (c) said main and said error amplifiers being disposed on substrates with the electronic components thereof being constructed and arranged as mirror images of one another; and
   (d) said common circuit board and said main and error amplifier being mounted within a housing of thermally conductive material with said amplifiers being disposed in heat conductive relation with said housing.

9. The feedforward amplifier as claimed in claim 8 wherein said housing includes a first chamber in which said common circuit board is mounted and second and third chambers in which said main and error amplifiers are matched.

10. The feedforward amplifier as claimed in claim 9 wherein said main and said error amplifier are disposed on heat sinks, said second and third chambers including surfaces for engagement with said amplifier heat sinks to permit heat transfer from said amplifiers to said housing.

11. The feedforward amplifier as claimed in claim 8 wherein said housing includes a central platform on which said common circuit board is disposed, said main and said error amplifier being disposed on the opposite side of said platform.

12. The feedforward amplifier as claimed in claim 11 wherein said central platform includes releasable connector means for connecting said main and error amplifier to said common circuit board.

13. The feedforward amplifier as claimed in claim 8 wherein said housing includes parallel side walls and parallel end walls and input and output connectors extending through said end walls.

14. The feedforward amplifier as claimed in claim 8 wherein said housing includes parallel side walls and a metallic shield disposed between said side walls, said shield surrounding said attenuator means to thereby shield said main and error amplifiers from said attenuator means and from each other.

* * * * *